United States Patent
Kojori

(10) Patent No.: US 7,622,910 B2
(45) Date of Patent: Nov. 24, 2009

(54) METHOD AND APPARATUS FOR AC INTEGRATED CURRENT SENSOR

(75) Inventor: Hassan Ali Kojori, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/716,592

(22) Filed: Mar. 12, 2007

(65) Prior Publication Data
US 2008/0084201 A1 Apr. 10, 2008

Related U.S. Application Data

(60) Provisional application No. 60/849,837, filed on Oct. 6, 2006.

(51) Int. Cl.
G01R 15/18 (2006.01)

(52) U.S. Cl. .................................... 324/127; 324/105

(58) Field of Classification Search ............... 324/127, 324/117 H, 105
See application file for complete search history.

(56) References Cited

U.S. PATENT DOCUMENTS

| | | | |
|---|---|---|---|
| 2,889,519 A * | 6/1959 | Montgomery et al. ....... 324/127 |
| 3,289,079 A | 11/1966 | Ferguson |
| 3,739,274 A | 6/1973 | DePuy |
| 3,916,310 A * | 10/1975 | Stark et al. .................. 324/127 |
| 4,164,016 A | 8/1979 | Schuchard |
| 4,437,059 A | 3/1984 | Hauptmann |
| 4,683,513 A | 7/1987 | Miller |
| 4,700,131 A | 10/1987 | Miller |
| 4,713,604 A * | 12/1987 | Becker et al. ............... 324/500 |
| 4,731,549 A | 3/1988 | Hiddleson |
| 4,801,883 A | 1/1989 | Muller et al. |
| 4,886,980 A | 12/1989 | Fernandes et al. |
| 4,914,382 A | 4/1990 | Douville et al. |
| 4,967,145 A | 10/1990 | Davies |
| 5,017,859 A | 5/1991 | Engel et al. |
| 5,041,780 A | 8/1991 | Rippel |
| 5,157,594 A * | 10/1992 | Glennon ...................... 363/41 |
| 5,485,393 A | 1/1996 | Bradford |

(Continued)

FOREIGN PATENT DOCUMENTS

GB 2351620 1/2001

OTHER PUBLICATIONS

Allegro MicroSystems Inc. (2004) "Current Sensor: ACS752SCA-050" Rev. 6 pp. 1-12.

(Continued)

*Primary Examiner*—Ha Tran T Nguyen
*Assistant Examiner*—Richard Isla Rodas
(74) *Attorney, Agent, or Firm*—Oral Caglar, Esq.

(57) ABSTRACT

Integrated current sensors are used in AC electric power systems. An integrated current sensor according to one embodiment comprises: an inductor (101), wherein an AC current passes through the inductor (101); an integrator circuit (103), the integrator circuit (103) receiving a voltage associated with the AC current; a gain control circuit (116) operationally connected to the integrator circuit (103), the gain control circuit (116) outputting a gain controlled signal; and a compensation circuit (115) operationally connected to at least two of the integrator circuit (103), the gain control circuit (116), and the inductor (101), to compensate for parameter variation induced in the gain controlled signal or in the output of the integrator circuit (103).

3 Claims, 11 Drawing Sheets

U.S. PATENT DOCUMENTS

| | | | |
|---|---|---|---|
| 5,539,354 | A | 7/1996 | Carsten |
| 5,587,652 | A | 12/1996 | Berkcan et al. |
| 5,815,391 | A * | 9/1998 | Pelly .......................... 363/98 |
| 6,094,044 | A | 7/2000 | Kustera et al. |
| 6,194,961 | B1 | 2/2001 | Passeraub |
| 6,366,076 | B1 | 4/2002 | Karrer et al. |
| 6,456,059 | B1 * | 9/2002 | Blakely ...................... 324/127 |
| 6,559,648 | B2 | 5/2003 | Baumgaertl et al. |
| 6,614,218 | B1 | 9/2003 | Ray |
| 6,617,858 | B1 | 9/2003 | Baumgaertl et al. |
| 6,621,141 | B1 | 9/2003 | Van Schuylenbergh et al. |
| 6,744,250 | B2 | 6/2004 | Hauenstein |
| 6,781,359 | B2 * | 8/2004 | Stauth et al. ............ 324/117 H |
| 6,828,770 | B1 | 12/2004 | McCauley et al. |
| 6,885,183 | B2 | 4/2005 | Kato |
| 6,940,735 | B2 * | 9/2005 | Deng et al. ................... 363/37 |
| 6,943,537 | B2 * | 9/2005 | Blakely ...................... 324/127 |
| 6,976,300 | B2 | 12/2005 | Ahn et al. |
| 7,098,630 | B2 | 8/2006 | Jonsson |
| 7,239,123 | B2 * | 7/2007 | Rannow et al. ......... 324/117 R |
| 7,362,086 | B2 * | 4/2008 | Dupuis et al. ............... 324/127 |
| 2003/0102780 | A1 * | 6/2003 | Nakatsuka et al. .......... 310/366 |
| 2003/0184940 | A1 * | 10/2003 | Staver et al. ............... 361/93.6 |
| 2004/0183522 | A1 | 9/2004 | Gunn et al. |
| 2008/0297956 | A1 * | 12/2008 | Van Zundert et al. .......... 361/1 |

OTHER PUBLICATIONS

Caddock Electronics Inc Data Sheet (2004): Type MV Low Resistance Power Film Resistors www.caddock.com.

Caddock Electronics Inc Data Sheet (2004): Type SR Precision Current Sense Resistors www.caddock.com.

Isotek Corp Data Sheet: PMA, PMD—Precision Current Sensing Resistors www.isotekcorp.com.

Isotek Corp Data Sheet: RTO—Precision Current Sensing Resistors www.isotekcorp.com.

Isotek Corp Data Sheet: RUG-Z—Precision Current Sensing Resistors www.isotekcorp.com.

Sentron AG (2004), "Operation and Application of the Sentron CSA-1V-SO Surface Mount Current Sensor", Aug. 17, 2004 pp. 1-14.

TT Electronics PLC Data Sheet: Oars Series—Open Air Sense Resistors www.irctt.com Wirewound and Film Technologies Division.

* cited by examiner ns entirety.

METHOD AND APPARATUS FOR AC INTEGRATED CURRENT SENSOR

The present application claims priority under 35 USC §119 (e) to U.S. Provisional Application No. 60/849,837 filed Oct. 6, 2006, which is hereby incorporated by reference herein in its entirety.

CROSS REFERENCE TO RELATED APPLICATIONS

This non-provisional application is related to co-pending non-provisional application titled "Method and Apparatus for DC Integrated Current Sensor" filed concurrently herewith, the entire contents of which are hereby incorporated by reference.

BACKGROUND OF THE INVENTION

1. Field of the Invention

The present invention is related to electric power systems, and more particularly to a method and apparatus for integrating an AC current sensor with an AC inductor.

2. Description of the Related Art

Current sensors are essential components in electric power systems. Current sensors determine current magnitude and direction at various circuit locations, facilitate proper control, protection and/or monitoring of the overall electrical system, etc. In particular, in a More Electric Aircraft (MEA) architecture, a large number of stand-alone current sensors are used, in addition to various common-mode and differential-mode inductors, as required for the power topology and/or for proper Electromagnetic Interference (EMI) and Power Quality mitigation.

Typical/conventional stand-alone current sensors and inductors are heavy and expensive, and need to be used together with bus-bars, cables, and other mounting fixtures inside a circuit. For each typical/conventional current sensor employed in an electric power system, the system is disturbed at two different places, where the current sensor contacts are connected to the electric power system. Hence, installation of typical/conventional current sensors in electric power systems causes significant disturbances. Typical/conventional current sensors also require proper thermal management. Hence, additional parts are needed with typical/conventional current sensors, which reduces reliability and adds extra weight, volume, cost and complexity to electrical circuits.

Disclosed embodiments of this application address these and other issues by integrating an AC inductor filter/choke with a current sensor, or by modifying an AC inductor to measure AC current in the same integrated package. Methods and apparatuses of the present invention implement the functions of inductor and current sensor in one integrated package. In one embodiment, an AC inductor is combined with an integrator, a gain control circuit, and a compensation circuit, to obtain an integrated AC inductor/current sensor that performs both inductive and current sensing functions. The integrated AC inductor/current sensor outputs a voltage proportional to an input current through the inductor. In another embodiment, an integrated inductor/current sensor includes two windings around a magnetic core, and outputs a voltage proportional to an input current through one of the windings. In other embodiments, typical/conventional current sensors are integrated with AC inductors into one package. The integrated AC inductor/current sensors of the current invention have wide current/temperature operating range, are lightweight and cost-effective, and provide highly accurate current measurements.

SUMMARY OF THE INVENTION

The present invention is directed to integrated current sensors for use in AC electric power systems. According to a first aspect of the present invention, an integrated current sensor for use in an AC electric power system comprises: an inductor, wherein an AC current passes through the inductor; an integrator circuit, the integrator circuit receiving a voltage associated with the AC current; a gain control circuit operationally connected to the integrator circuit, the gain control circuit outputting a gain controlled signal; and a compensation circuit operationally connected to at least two of the integrator circuit, the gain control circuit, and the inductor, to compensate for parameter variation induced in the gain controlled signal or in the output of the integrator circuit.

According to a second aspect of the present invention, an integrated current sensor for use in an AC electric power system comprises: an inductor including a resistive component and an inductive component, wherein an AC current passes through the inductor; a differential circuit receiving a voltage associated with the inductor, and outputting a voltage associated with the inductive component; an integrator circuit, the integrator circuit outputting an electrical parameter proportional to the AC current; and a feedback circuit operationally connected to the integrator circuit and to the differential circuit, the feedback circuit outputting a voltage associated with the resistive component.

According to a third aspect of the present invention, an integrated current sensor for use in an AC electric power system comprises: a magnetic core; a first winding wound around the core, the first winding carrying an AC current; a second winding wound around the core, the second winding carrying a current proportional to the AC current; and terminals connected to the first or second winding, to output a voltage proportional to the AC current.

According to a fourth aspect of the present invention, an integrated current sensor for use in an AC electric power system comprises: an inductor, wherein an AC current passes through the inductor; an integrator circuit, the integrator circuit receiving a voltage associated with the AC current; and a resistive network voltage divider connected to the inductor, to obtain a virtual ground, wherein the integrated current sensor allows measurement of AC system voltage with respect to the virtual ground in the same integrated package.

According to a fifth aspect of the present invention, an integrated current sensor for use in an AC electric power system comprises: an inductor, wherein an AC current passes through the inductor; and one current sensor selected from the group consisting of a current transformer, a Hall Effect current sensor, a shunt resistor, and a non-contact current sensor, wherein the current sensor and the inductor are packaged into a single package.

According to a sixth aspect of the present invention, an integrated current sensor for use in an AC electric power system comprises: an inductor, wherein an AC current passes through the inductor; a signal conditioning unit operationally connected to the inductor, the signal conditioning unit digitizing a second voltage proportional to a first voltage associated with the inductor, and outputting a third voltage; and a data processing unit inputting the third voltage, wherein the data processing unit performs integration for the third voltage, and outputs at least one signal for control, protection, or Prognostics Health Monitoring.

BRIEF DESCRIPTION OF THE DRAWINGS

Further aspects and advantages of the present invention will become apparent upon reading the following detailed description in conjunction with the accompanying drawings, in which.

DETAILED DESCRIPTION

Figure 1:
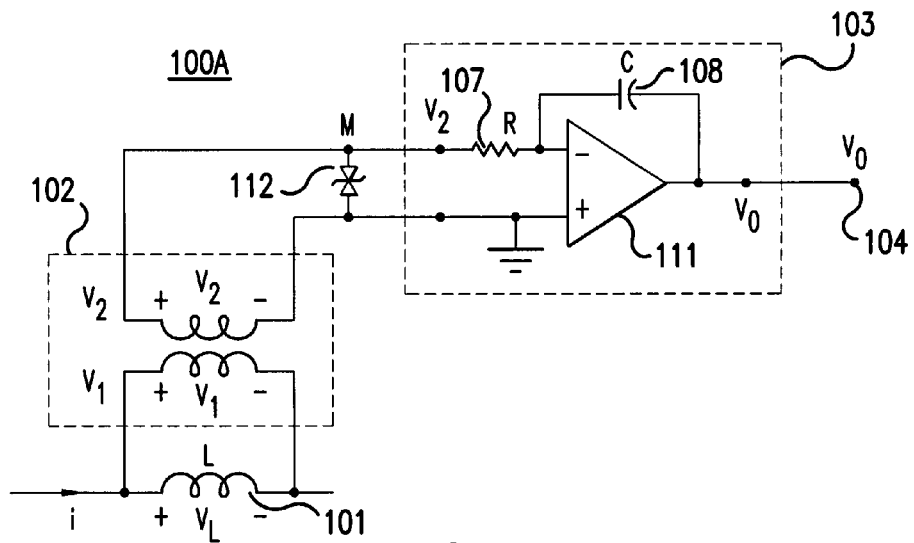
FIG. 1 illustrates a circuit diagram for an integrated current sensor for AC circuits according to an embodiment of the present invention.

Aspects of the invention are more specifically set forth in the accompanying description with reference to the appended figures. FIG. 1 illustrates a circuit diagram for an integrated current sensor for AC circuits according to an embodiment of the present invention. The circuit 100A illustrated in FIG. 1 includes the following components: an inductor 101; a transformer 102; and an output block 103. Operation of the circuit 100A in FIG. 1 will become apparent from the following discussion.

Most electric power systems include power conversion and distribution equipment for which AC inductors are needed as part of the power topology. For example, boost inductors are used in active rectifiers, and as filters to improve power quality and/or EMI. The current invention describes how one single integrated package can be produced to achieve functions of inductor and current sensor.

With reference to FIG. 1, a current i flows through the inductor 101. The integrated current sensor 100A illustrated in FIG. 1 measures the current i indirectly, by monitoring the voltage $v_L$ across the inductor 101.

Transformer 102 is optional. Transformer 102 may be a small voltage transformer, used when isolation is required. Transformer 102 may be, for example, an ideal transformer, but other types of transformers may also be used. For a turns-ratio of $$\frac{n_1}{n_2}$$

for transformer 102, transformer voltages obey the relationship $$\frac{v_1}{v_2} = \frac{n_1}{n_2},$$

where $v_1$ and $v_2$ are the voltages on the transformer coils. Since $$v_1 = v_L = L\frac{di}{dt} \text{ and } \frac{v_1}{v_2} = \frac{n_1}{n_2},$$

it follows that $$v_2 = \frac{n_2}{n_1}v_L = \frac{n_2}{n_1}L\frac{di}{dt},$$

where L is the inductance of inductor 101. The output of transformer 102 is fed to output block 103.

In one embodiment, output block 103 is an integrator circuit. Integrator block 103 may include, for example, a resistor 107 of resistance R, a capacitor 108 of capacitance C, and an amplifier 111. Other circuit configurations may also be used for integrator block 103. The output voltage $v_0$ of block 103 is measured at terminal 104. The output voltage $v_0$ can be calculated as:

$$v_0 = -\frac{1}{RC}\int_0^\tau v_2 \, dt \qquad (1)$$

$$= -\frac{1}{RC}\int_0^\tau \frac{n_2}{n_1} v_L \, dt$$

$$= -\frac{n_2}{n_1 RC}\int_0^\tau L\frac{di}{dt} \, dt$$

$$= -\frac{n_2 L}{n_1 RC}\int_0^\tau di$$

$$= -\frac{n_2 L}{n_1 RC} i.$$

For the case when $$-\frac{n_2 L}{n_1 RC}$$

is a constant $$-\frac{n_2 L}{n_1 RC} = K,$$

the output voltage $v_O$ can be expressed as:

$$v_0 = K \cdot i. \qquad (2)$$

Hence, when the output of transformer 102 is fed to an integrator (block 103), the output voltage $v_O$ is proportional to the line current i as shown by equation (2). Therefore, current i can be obtained from a measurement of the output voltage $v_O$. Thus, circuit 100A in FIG. 1 is an integrated inductor/current sensor that provides inductive and current measuring functions for current sensing applications. The integrated current sensor 100A can be used, for example, in high current sensing applications. In an alternative embodiment, the integrator in block 103 is replaced by a non-inverting integrator circuit, which may be used for setting proper polarity. A transorb 112 is included in the current sensor 100A, to clamp potential over-voltages that may occur in the circuit. Such over-voltages can be harmful to sensitive electronic parts that are connected to point M in the circuit 100A. In the derivation of equation (2), the effect of inductor resistance was considered negligible. The effect of inductor resistance is negligible when $\omega_0 L \gg R_L$, where $\omega_0$ is the fundamental frequency associated with current and voltage waveforms that pass through the inductor 101, and $R_L$ is the resistance of inductor 101.

Figure 2:
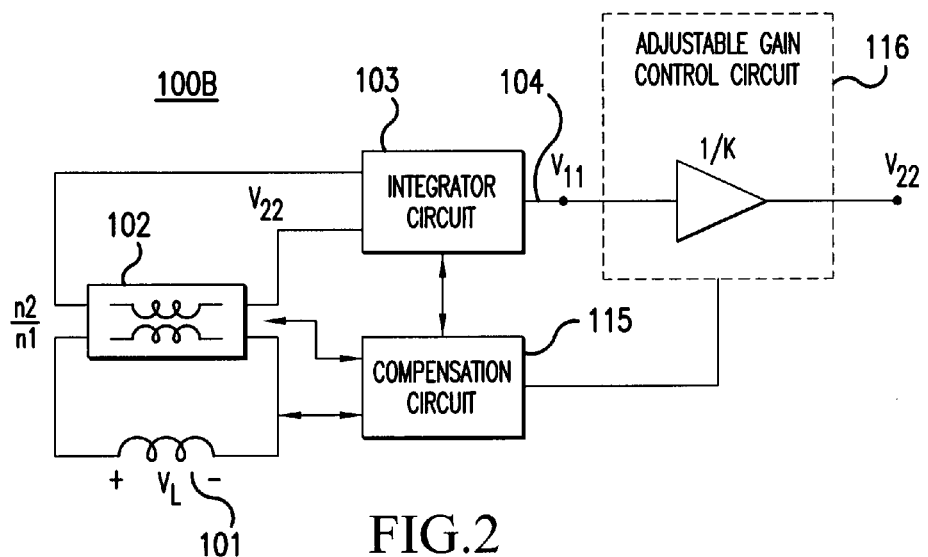
FIG. 2 illustrates a circuit diagram for an integrated current sensor for AC circuits that controls gain and compensates for parameter variation according to a second embodiment of the present invention.

FIG. 2 illustrates a circuit diagram for an integrated current sensor 100B for AC circuits that controls gain and compensates for parameter variation according to a second embodiment of the present invention. The integrated current sensor 100B illustrated in FIG. 2 includes the following components: an inductor 101; a transformer 102; an integrator circuit 103; an adjustable gain control circuit 116; and a compensation circuit 115. The adjustable gain control circuit 116 and the compensation circuit 115 are used to compensate for parameter variation and obtain a precision current sensor.

With the integrated current sensor 100B illustrated in FIG. 2, the current-to-voltage ratio can be maintained equal to unity, by monitoring the temperature, or other sources of circuit parameter variation, through the monitoring/compensation circuit 115. The gain for the integrated current sensor 100B is adjusted accordingly through adjustable gain control circuit 116.

In an alternative implementation, the order of integrator circuit 103 and adjustable gain control circuit 116 can be changed/reversed.

With the integrated current sensor 100B, the AC current is measured in real-time and the need for a current sensor separate from inductor 101 is eliminated. The integrated current sensor 100B provides additional significant benefits. For example, instead of a current measurement, a voltage is measured, and a linear current-to-voltage transformation provides data to determine the current. The integrated current sensor 100B has a wide-dynamic range, as the inductor does not typically saturate. Moreover, effects of parameter variation can be corrected with a look-up table, for example. Galvanic isolation can be incorporated into the integrated current sensor 100B with a voltage transformer. Galvanic isolation can be further integrated into the inductor core using integrated magnetics elements. Compensation circuits, such as, for example, look-up table based circuits, can be incorporated into the integrated current sensor 100B, to compensate for parameter variations due to temperature variations. Failure modes of current transformers are eliminated. An example of a transformer failure mode is an event in which a secondary winding is opened, inducing high voltages at the output of the transformer. With the integrated current sensor 100B, reductions in cost, weight, volume, and power dissipation are achieved.

Conventional/traditional current sensing systems cause significant problems in high power applications. Stand-alone high current rating AC current sensors present multiple drawbacks. They are very expensive, bulky and heavy. They also require additional custom H/W such as interconnecting busbars/cables and other mounting fixtures for proper installation and thermal management. Thermal management is particularly difficult to achieve for stand-alone AC current sensors, due to trapped heat generated by internal power dissipation. Trapped heat is a significant problem in electric power systems, and particularly so in high power applications.

The integrated current sensor 100B of the current invention addresses these and other problems. The integrated current sensor 100B is easy to install, and provides thermal management. Integration of inductive and current sensing functions in one package reduces parts-count and eliminates standalone current sensors.

Figure 3:
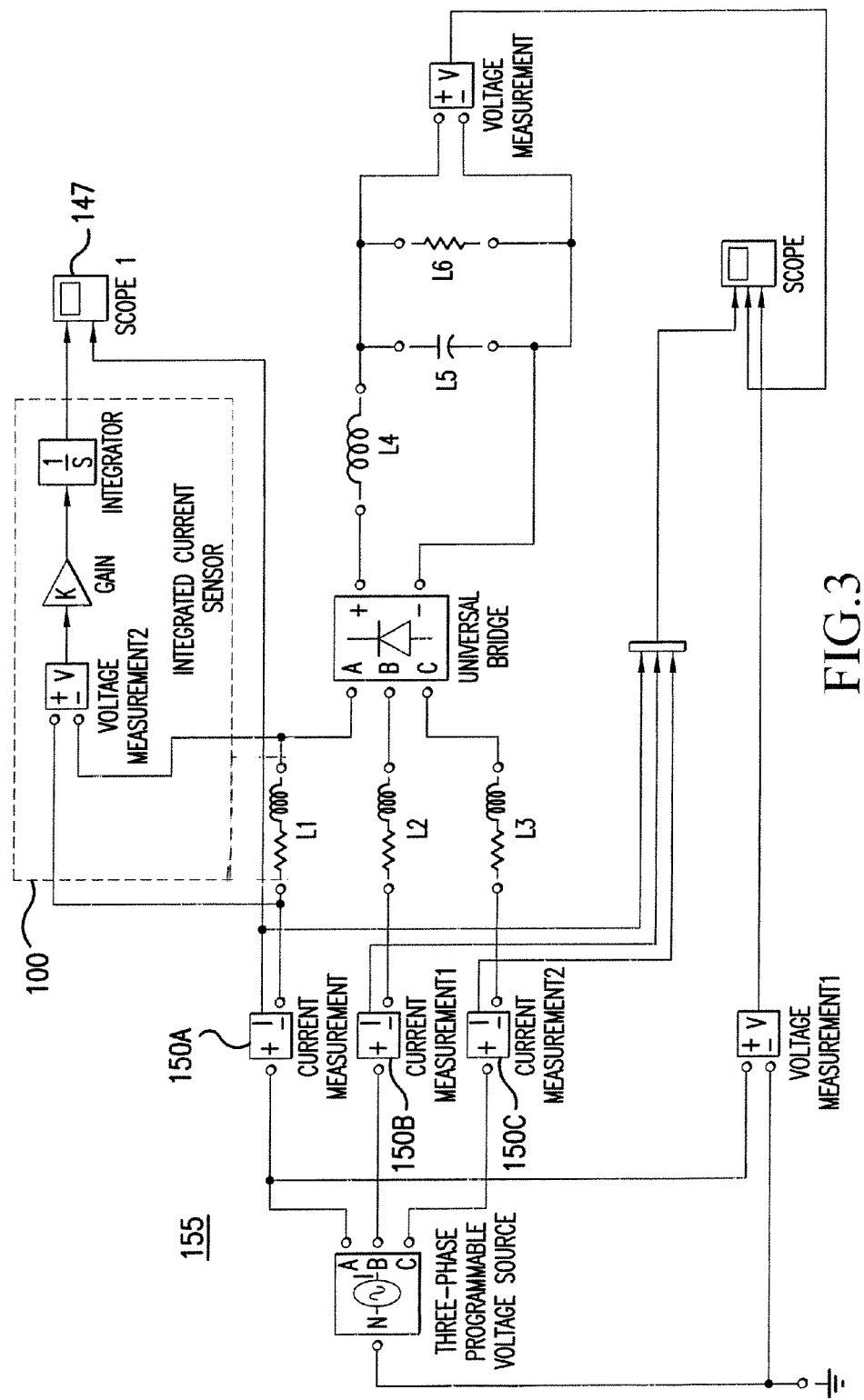
FIG. 3 illustrates an AC circuit in which an integrated current sensor is used to measure power system line AC currents by measuring the voltage across an AC inductor in accordance with principles of the present invention.

FIG. 3 illustrates an AC circuit 155 in which an integrated current sensor 100 is used to measure power system line AC currents by measuring the voltage across an AC inductor L1 in accordance with principles of the present invention. The circuit 155 in FIG. 3 is a three-phase circuit and has been simulated in the Matlab-Simulink environment. An integrated current sensor 100 for one phase (phase A) is shown in FIG. 3, but more integrated current sensors 100 may be included, for each phase. Components inside the integrated current sensor 100 have been described at FIGS. 1 and 2. Typical/conventional current sensors 150A, 150B, and 150C are also included in the circuit 155. The typical/conventional current sensors 150A, 150B, and 150C measure current for each phase in the three-phase circuit.

Figure 4A:
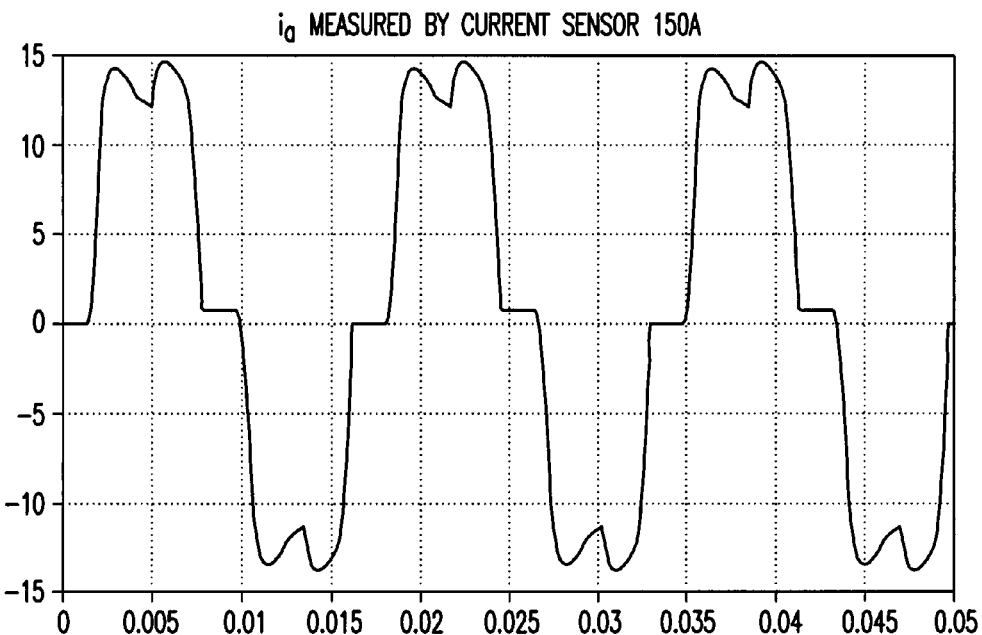
FIG. 4A illustrates a current measurement by a typical/conventional current sensor for the AC circuit in FIG. 3.
Figure 4B:
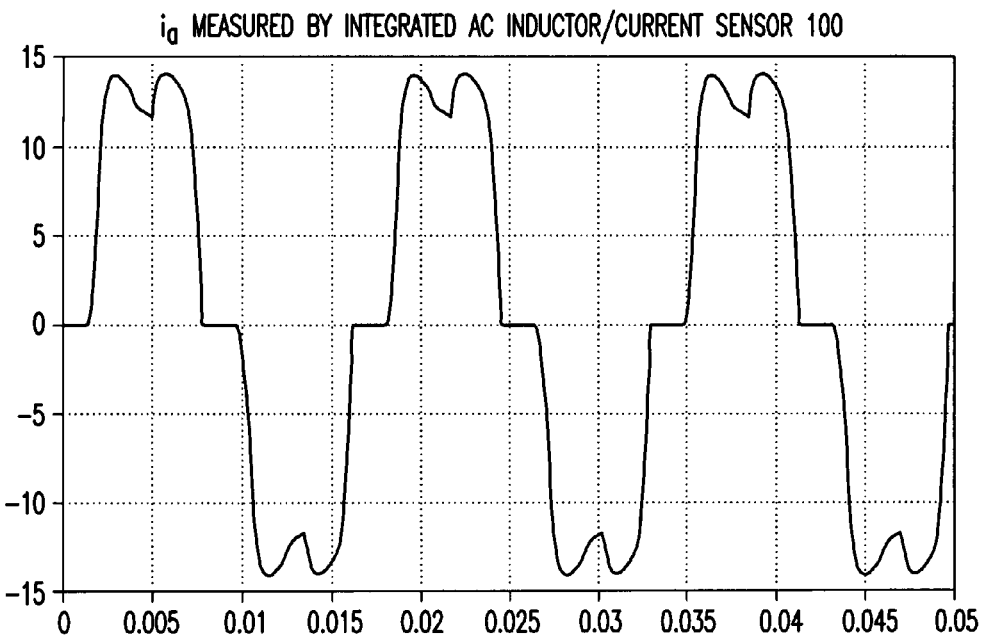
FIG. 4B illustrates a current measurement performed by an integrated current sensor included in the AC circuit in FIG. 3, in accordance with principles of the present invention.

The typical/conventional current sensor 150A measures the AC current waveform for phase A directly. On the other hand, the integrated current sensor 100 measures the AC current waveform for phase A by measuring the voltage across inductor L1. FIGS. 4A and 4B illustrate current waveform simulation results for circuit 155 illustrated in FIG. 3. FIG. 4A illustrates phase A current $i_a$, as measured by the typical/conventional current sensor 150A. FIG. 4B illustrates phase A current $i_a$, as measured by the integrated current sensor 100 in accordance with principles of the present invention. A comparison of FIGS. 4A and 4B shows that the current waveform measured by the typical/conventional current sensor 150A is very close in value and shape to the current waveform measured by the integrated current sensor 100. This demonstrates proper operation of the integrated current sensor 100 with an acceptable error. A small error that may appear at low current levels is due to the fact that resistive voltage drop of the inductor has been ignored. This error can be eliminated by integrated current sensors of the present invention described at FIGS. 5A and 5B.

Figure 5A:
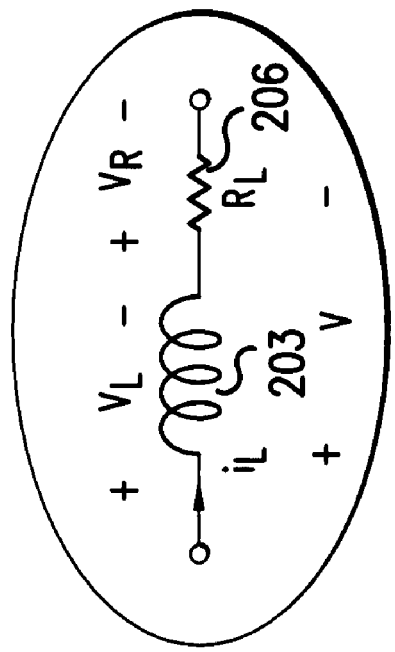
FIG. 5A illustrates design aspects for an integrated current sensor that includes the effect of inductor resistance according to a third embodiment of the present invention.
Figure 5A:
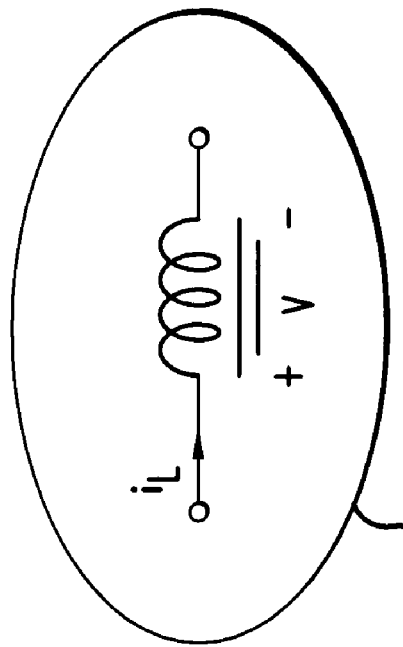

FIG. 5A illustrates design aspects for an integrated current sensor that includes the effect of inductor resistance according to a third embodiment of the present invention.

For the circuit illustrated in FIG. 1, inductor resistance $R_L$ was assumed to be much smaller than $\omega_0 L$, where $\omega_0$ is the fundamental frequency associated with current and voltage waveforms that pass through the inductor 101. FIG. 5A presents a more detailed analysis of inductor performance including inductor resistance $R_L$.

As illustrated in FIG. 5A, an inductor component 201 having an inductor resistance can be represented by a circuit that includes an inductor 203 of inductance L and a resistor 206 of resistance $R_L$. In equations (1) and (2) associated with FIG. 1, the effect of inductor resistance was ignored, as is appropriate for the case when $\omega_0 L >> R_L$, where $\omega_0$ represents the fundamental frequency component through the inductor component 201.

For an inductor component 201 having an inductance L and a resistance $R_L$, as illustrated in FIG. 5A, the voltage v over the inductor 201 can be expressed as:

$$v = v_L + v_R \quad (3)$$

where $v_L$ is the voltage over the inductor portion 203, and $v_R$ is the voltage over the resistive portion 206. Using the current $i_L$ through the inductor component 201, the voltage v can be expressed as:

$$v = v_L + v_R = L\frac{di_L}{dt} + R_L i_L. \quad (4)$$

From equation (4) it follows that:

$$v_L = L\frac{di_L}{dt} = v - R_L i_L. \quad (5)$$

Hence, the current $i_L$ through the inductor component 201 can be expressed as:

$$di_L = \frac{1}{L}(v - R_L i_L)dt \quad (6)$$

Integration on both sides of equation (6) leads to:

$$\int di_L = \int \frac{1}{L}(v - R_L i_L)dt. \quad (7)$$

Equation (7) leads to:

$$i_L = \int \frac{1}{L}(v - R_L i_L)dt = \int \frac{1}{L}v_L dt. \quad (8)$$

Figure 5B:
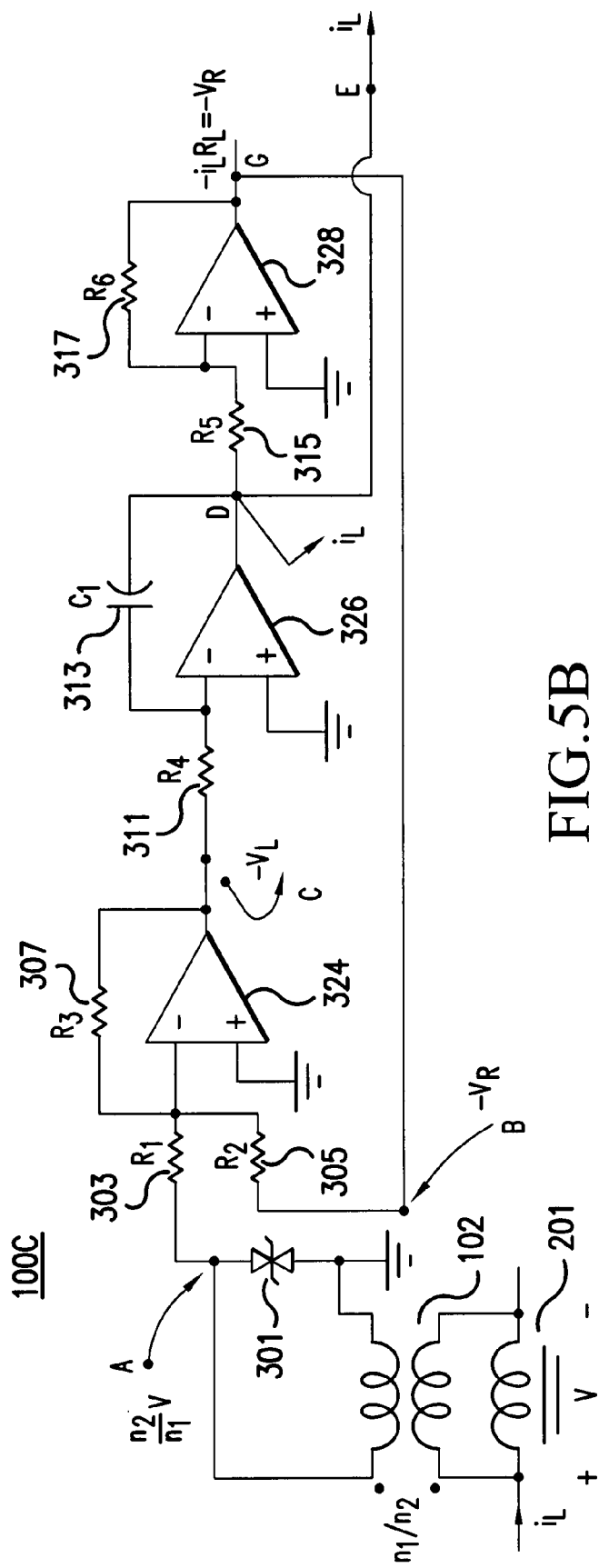
FIG. 5B illustrates an integrated current sensor for AC circuits according to a third embodiment of the present invention.

FIG. 5B illustrates an integrated current sensor 100C for AC circuits according to a third embodiment of the present invention. The integrated current sensor 100C illustrated in FIG. 5B incorporates an inductor with inductor resistance, as described at FIG. 5A.

The design of the integrated current sensor circuit 100C includes the effect of inductor resistance $R_L$. The resistances in the circuit in FIG. 5B obey the following relationships:

$$\frac{R_6}{R_5} = R_L, \quad (9)$$

$$R_1 = R_2, \quad (10)$$

and $$\frac{R_3}{R_1} = \frac{n_2 R_4 C_1}{n_1 L}, \quad (11)$$

where $n_1$, and $n_2$ are the number of turns of transformer 102. Hence, for the current sensor circuit 100C, the voltage output of amplifier 324 is $v_L$, the current output of integrator stage 326 is $i_L$, and the output voltage at point G is the inductor resistance voltage $v_R$, where:

$$v_R = i_L R_L. \quad (12)$$

The resistance value $R_4$ and capacitance value $C_1$ determine the performance of the integrator portion for the circuit in FIG. 5B. Parameters $R_4$ and $C_1$ can be selected to achieve good dynamic response and avoid saturation of the integrator. Parameters $R_4$ and $C_1$, and other resistance and capacitance parameters for the circuit 100C can be selected to bypass noise and eliminate offsets.

A transorb 301 is added to the current sensor 100C in FIG. 5B, to clamp potential over-voltages that may occur in the circuit. Such over-voltages can be harmful to sensitive electronic parts that are connected to point A in the circuit.

Figure 6A:
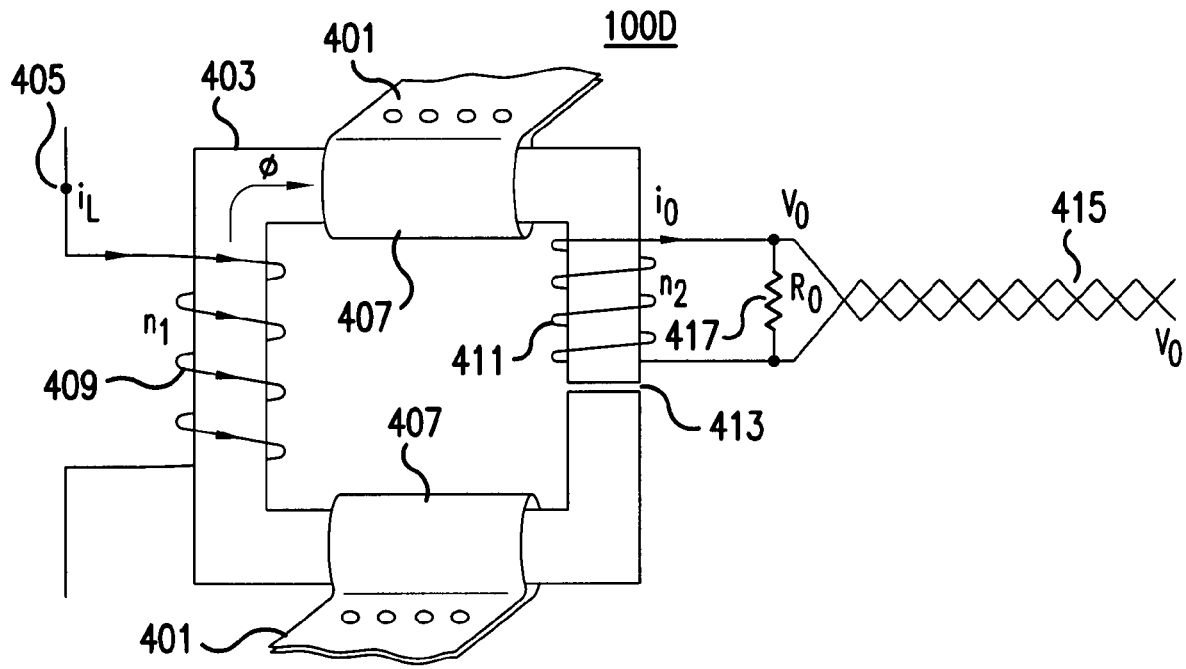
FIG. 6A illustrates an integrated AC inductor/current sensor using a second inductor winding according to a fourth embodiment of the present invention.

FIG. 6A illustrates an integrated inductor/AC current sensor 100D using a second inductor winding according to a fourth embodiment of the present invention. The integrated inductor/AC current sensor 100D illustrated in FIG. 6A includes the following components: a first winding 409 with $n_1$ turns; a second winding 411 with $n_2$ turns; a core 403; cooling brackets 407 with cooling bracket surfaces 401; a burden resistor 417 of resistance $R_0$; and a twisted pair 415 for signal transmission. The core 403 includes an airgap 413. The second winding 411 for the inductor is introduced to measure AC current in the same manner as a current transformer. This winding arrangement is advantageous because the inductor and the current transformer share the core and the primary winding. Hence, only one simplified installation and one thermal management system are required for the integrated inductor/current sensor 100D.

In FIG. 6A, AC inductor current $i_L$ passes through the first winding 409 with $n_1$ turns. Cooling brackets 407 tightly embrace the core 403. Cooling brackets 407 are connected to a heat sink for good thermal management. Cooling brackets 407 may be connected to the heat sink through the top and bottom cooling bracket flat surfaces 401. A voltage signal $v_0$ is output through the twisted pair 415.

For the integrated inductor/AC current sensor 100D, the voltage $v_O$ can be expressed as:

$$v_0 = i_0 R_0 = \frac{n_2}{n_1} i_L R_0. \quad (13)$$

Hence, the output voltage $v_O$ is proportional to inductor current $i_L$. The coefficient $$\frac{n_2}{n_1} = R_0$$

can be calibrated versus temperature and magnitude of current. A compensation circuit can be added to sensor 100D, for better accuracy, as needed.

The integrated inductor/AC current sensor 100D achieves proper isolation. The core 403 and its windings 409 and 411 are properly insulated, and the cooling brackets 407 achieve good thermal management. Cooling brackets can be implemented as shown in FIG. 6A, or by other cooling means, depending on the geometry of the core and on the neighboring electrical systems.

The airgap 413 is introduced in the core 403 to prevent saturation. A core with an airgap can be implemented by many different techniques, and in a variety of shapes.

Figure 6B:
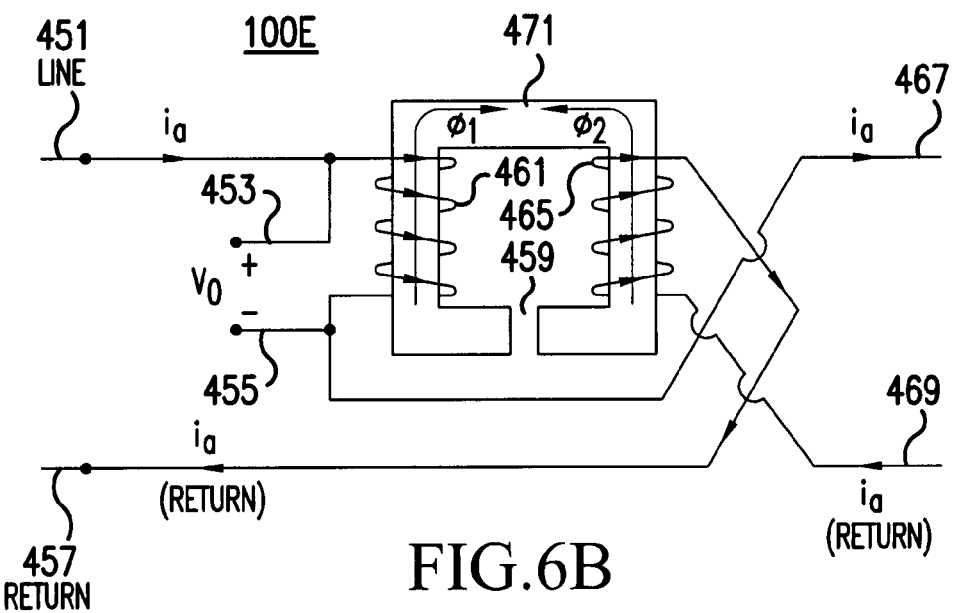
FIG. 6B illustrates an integrated current sensor for common-mode single-phase inductors according to a fifth embodiment of the present invention.

FIG. 6B illustrates an integrated current sensor 100E for common-mode (CM) single-phase inductors according to a fifth embodiment of the present invention. Integrated current sensor 100E detects current directly, without a need for an integrating circuit. The integrated current sensor 100E illustrated in FIG. 6B includes: a core 471 with an airgap 459; a first winding 461; a second winding 465; input line 451; output line 467; and return lines 469 and 457. The integrated current sensor 100E is implemented using the terminal voltage of the CM single-phase inductor.

The advantage of using a common-mode inductor is that the sensed voltage across one of the windings (e.g., $v_O$ in FIG. 6B) is directly proportional to the effective resistance of the winding R, $v_O = i_a R$, and hence no further integration is required. Moreover, if the low-side winding is used, high-voltage isolation is not required, which further simplifies the implementation of the integrated inductor/current sensor 100E. The integrated inductor/current sensor 100E allows detection of line current under normal mode of operation. The integrated inductor/current sensor 100E also allows the user to properly design the protection/sensing circuitry to be able to monitor (advantageously, through a single current sensor) other abnormal modes of operation, when excessive common-mode currents are flowing in the system.

As illustrated in FIG. 6B, on the common-mode inductor 100E, the "line" and "return" wires are twisted together and wound on core 471, usually with an airgap. The airgap is used to prevent core saturation, by making the inductor operate in the linear region of the B-H curve. When the "common-mode" current is negligible (i.e. when the "line" and "return" currents are equal, or are very close), $v_O$ is proportional to the effective resistance of the winding. Fluxes $\Phi_1$ and $\Phi_2$ cancel each other and there is no inductance when common-mode current is negligible.

The method and apparatus described at FIG. 6B are also applicable to 3-phase AC line power, as 3-phase incoming wires can be twisted together and then wound around the core. In this implementation, the sensed $v_O$ is usually a small voltage (similar to a sensing voltage across a sense shunt resistor). The sensed $v_O$ can be fed into an instrumentation amplifier (IN-AMP).

Figure 6C:
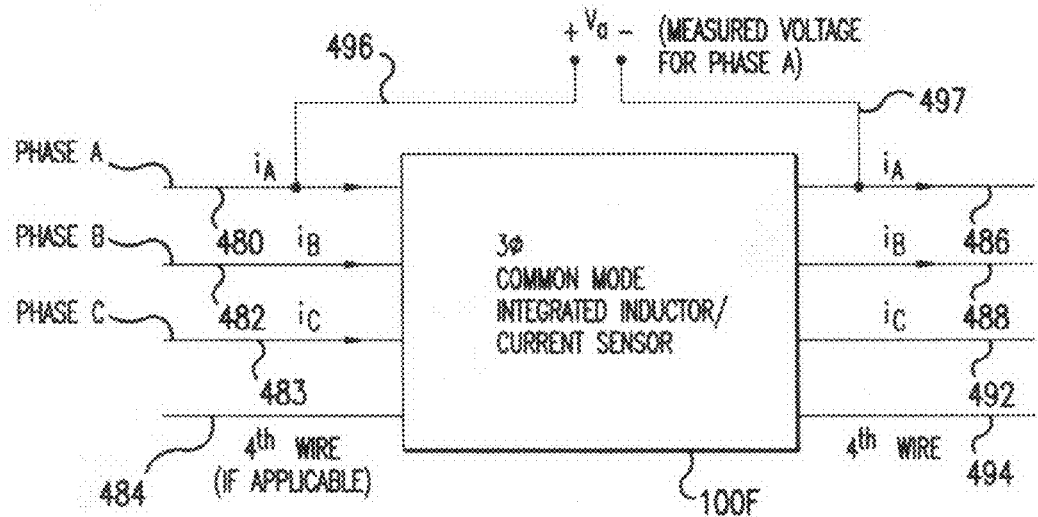
FIG. 6C illustrates an integrated current sensor for 3-phase inductors according to a sixth embodiment of the present invention.

FIG. 6C illustrates an integrated current sensor 100F for 3-phase inductors according to a sixth embodiment of the present invention. Construction of the 3-phase AC common-mode inductor 100F is similar to that of inductor 100E in FIG. 6B. In addition, windings for phases B and C are added to a gapped core included in the 3-phase CM integrated inductor/current sensor 100F. The windings for phases B and C are arranged in such a way that, under normal operation, the resultant flux through the core is zero. The voltage directly measured across each phase winding is the resistive voltage proportional to the corresponding phase current. Usually, a 3 $\Phi$ system has three-phases (A, B, and C), and only three wires are used to power a 3-$\Phi$ load. A $4^{th}$ wire may be included in the common-mode inductor, for a 4-wire system as shown in FIG. 6C.

Only phase A voltage $v_a$ is shown in FIG. 6C. When there is no common-mode fault, $v_a = i_a R$, where R is the known value of the effective resistance of the winding for phase A. The 3-phase CM integrated inductor/current sensor 100F may also be advantageously used to detect a common-mode (ground fault). Under this condition, there would be significant flux in the magnetic core, and the excess voltage for $$v_a = i_a R + L \frac{d i_a}{dt}$$

can be monitored to detect such a fault condition.

Other types of AC current sensing systems besides the systems described above can be integrated with AC inductors. In exemplary embodiments, non-contact current sensors (e.g., the CSA-1V-SO part described in further detail at FIGS. 7 and 9), different types of shunt resistors such as, for example, shunt resistors with 2 or 4 wire terminals on proper heat sinks, current transformers, Hall Effect current sensors, or other types of current sensors, can be integrated with AC inductors in one unit to obtain an integrated inductor/AC current sensor, according to a seventh embodiment of the present invention. Sensors from the ACS752SCA-50 current sensor family are other sensors that can be integrated with AC inductors in one unit to obtain an integrated inductor/AC current sensor. The ACS752SCA-50 current sensors are described in the Allegra Microsystems Inc. Datasheet "Current Sensor: ACS752SCA-050", the entire contents of which are hereby incorporated by reference.

Figure 11:
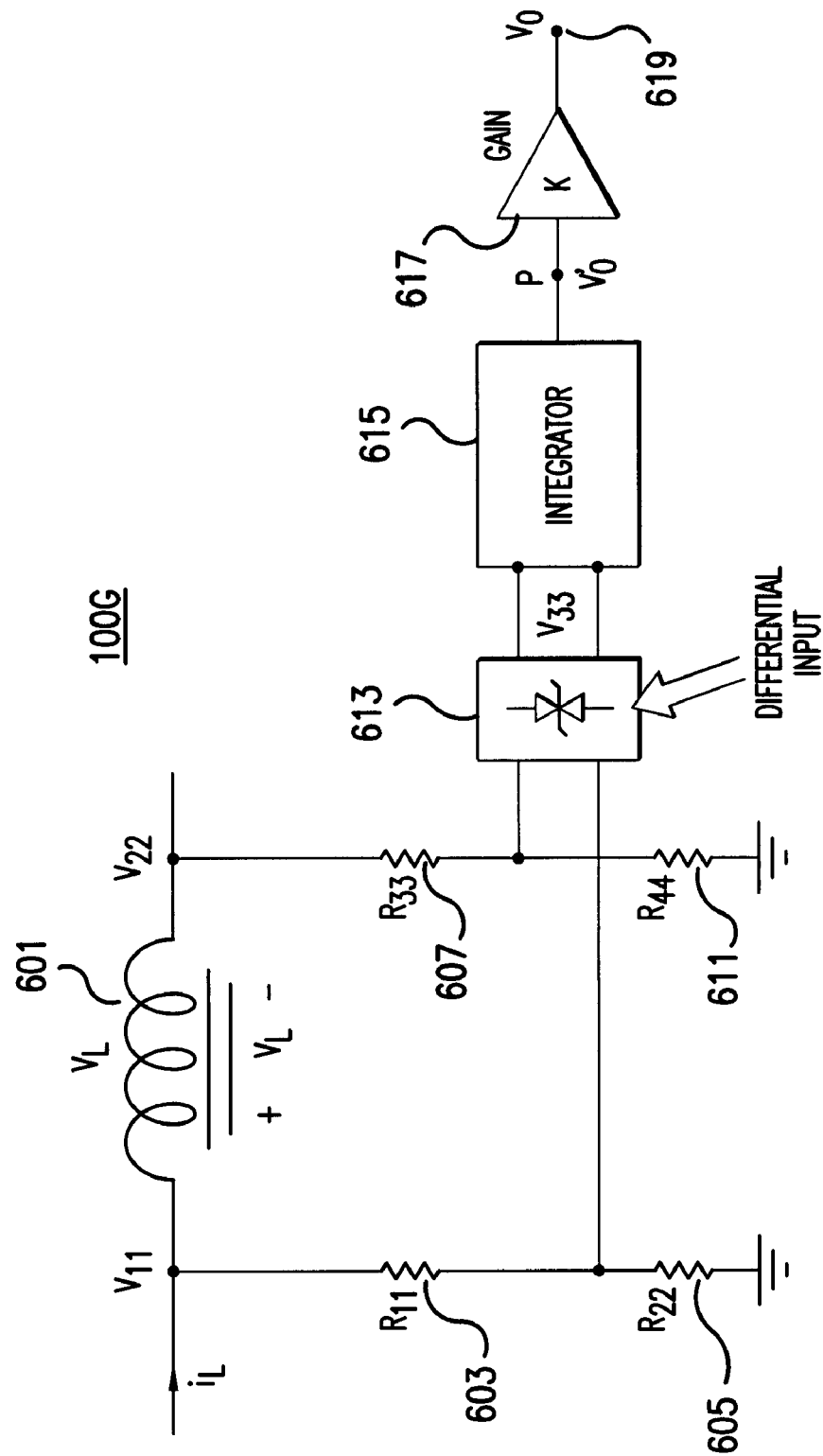
FIG. 11 illustrates a circuit diagram for an integrated current sensor that does not require an isolation op-amp according to an eighth embodiment of the present invention.

An isolation op-amp can be used in the integrated inductor/AC current sensor, to provide isolation. Alternatively, a virtual ground can be realized for the integrated inductor/AC current sensor, as shown in FIG. 11. An integrated inductor/AC current sensor with a virtual ground is more cost effective in circuit design, because it does not need isolation op-amps.

Figure 10A:
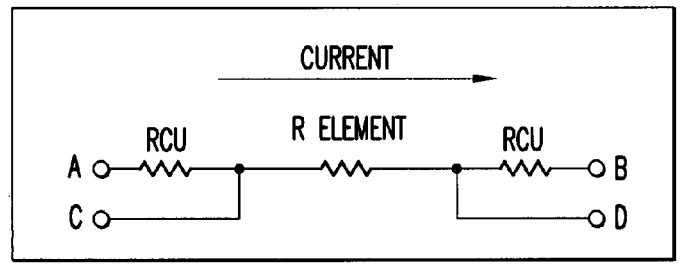
FIG. 10A illustrates a known four-wire resistor with Kelvin sense leads which can be integrated into an inductor/current sensor according to a seventh embodiment of the present invention.
Figure 10B:
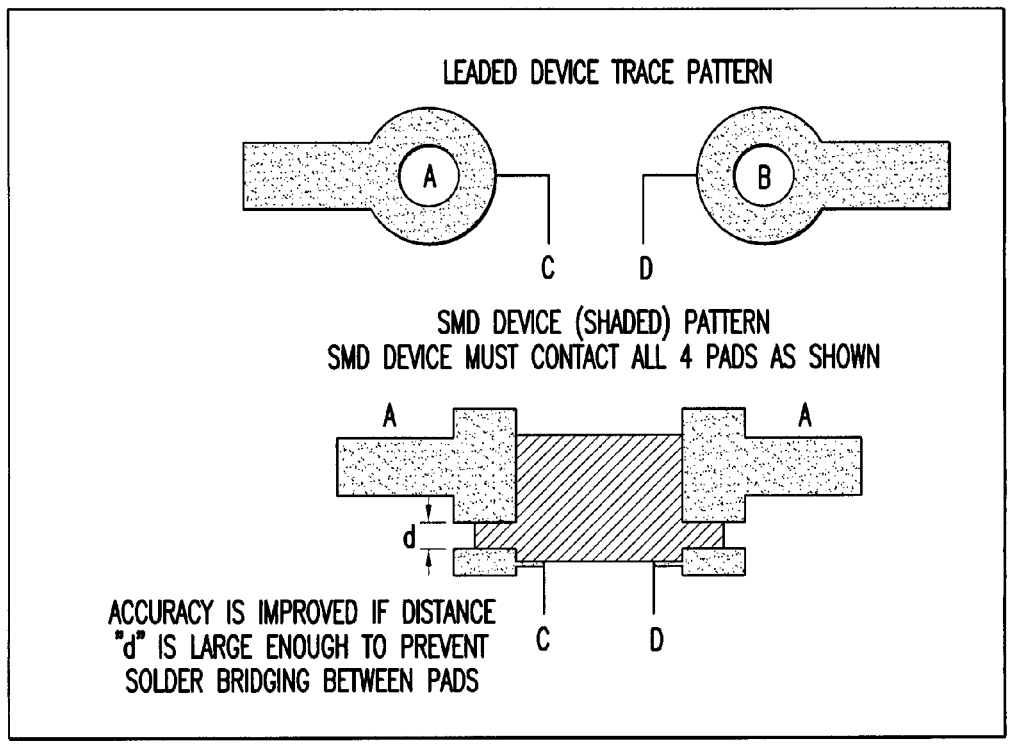
FIG. 10B illustrates aspects of simulations for a four-wire resistor using a PC board trace.

In a preferred embodiment, 4-wire Kelvin shunt resistors are used in an integrated inductor/AC current sensor, because they reduce end solder connection resistance variation caused by temperature variation, as further described at FIG. 10A. A 2-wire shunt resistor may also be used in an integrated inductor/AC current sensor. The 2-wire shunt resistor may be simulated to get the benefit of a 4-wire resistor part using PC-board trace, as shown in FIG. 10B.

Figure 7:
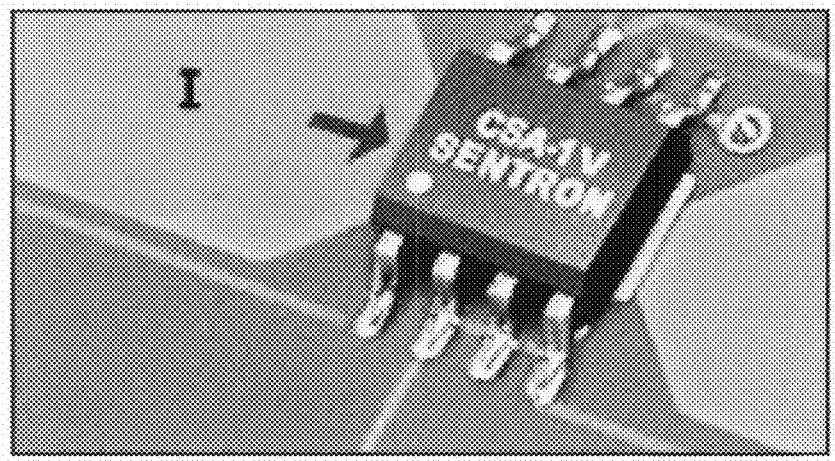
FIG. 7 illustrates a known non-contact current sensor which can be integrated into an inductor/current sensor according to a seventh embodiment of the present invention.

FIG. 7 illustrates a known non-contact current sensor that can be integrated into an inductor/current sensor according to a seventh embodiment of the present invention. The current sensor shown in FIG. 7 is a Sentron CSA-1V-SO, which is a surface mount current sensor. The Sentron CSA-1V-SO sensor is described in the Sentron Datasheet "Operation and Application of the Sentron CSA-1V-SO Surface Mount Current Sensor", the entire contents of which are hereby incorporated by reference. The Sentron CSA-1V-SO non-contact current sensor senses current by converting the magnetic field generated by current flowing through a conductor, to a voltage that is proportional to that field. The Sentron CSA-1V-SO non-contact current sensor can be integrated with an AC inductor in one unit, to obtain an integrated inductor/AC current sensor, according to a seventh embodiment of the present invention.

Figure 8:
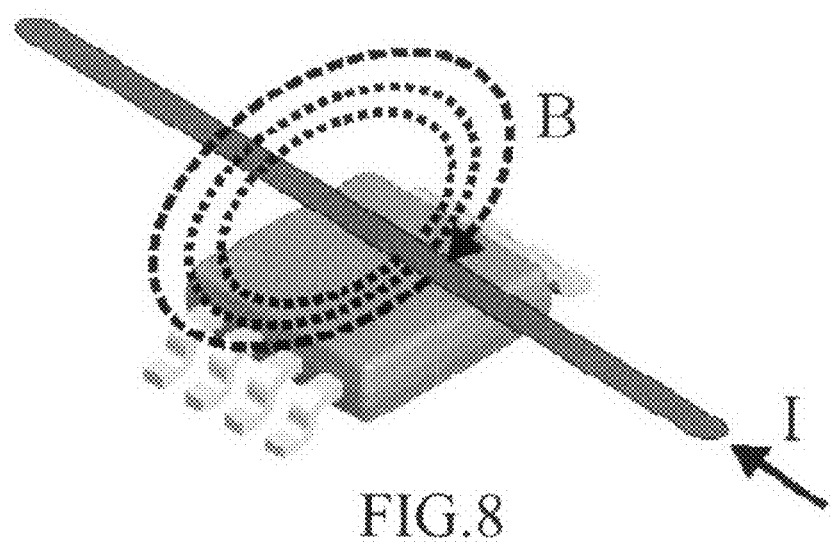
FIG. 8 illustrates aspects of the current sensing operation for a known non-contact current sensor.
Figure 9:
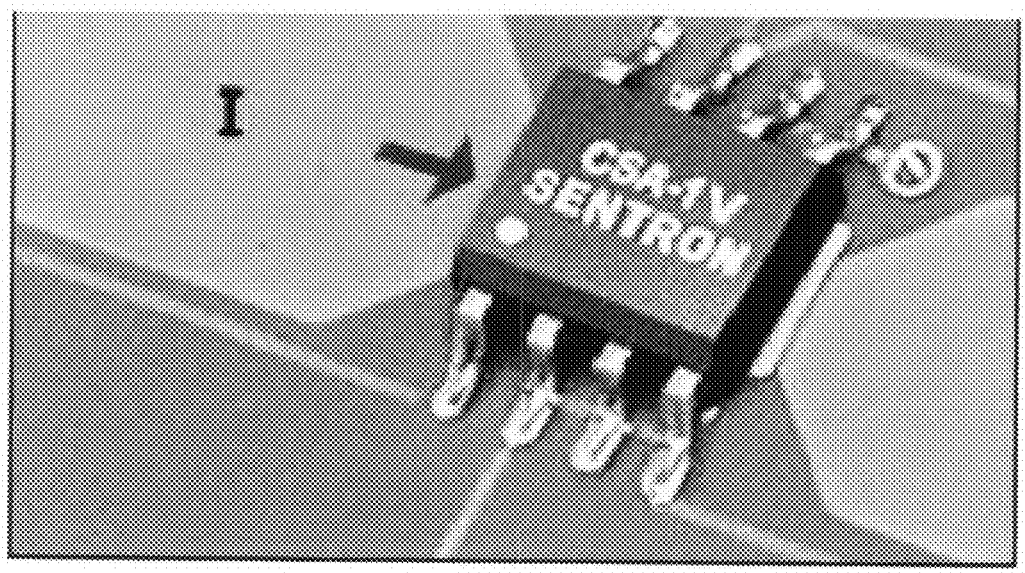
FIG. 9 illustrates aspects of the current sensing operation in a PCB for a known non-contact current sensor.

FIG. 8 illustrates aspects of the current sensing operation for a known non-contact current sensor. FIG. 9 illustrates aspects of the current sensing operation in a PCB for a known non-contact current sensor. The Sentron CSA-1V-SO non-contact current sensor can be used to measure current in an adjacent wire as shown in FIG. 8, or in a PCB trace, as shown in FIG. 9. On a PCB, conductors are mounted below the IC, as shown in FIG. 9. Sensitivity of an integrated current sensor including a non-contact current sensor (mV/Amp) can be increased significantly by placing the IC within a loop. Proper shielding and a "thermal isolation blanket" around sensitive circuitry will minimize ill effects of stray fields and excessive temperatures in an integrated package including the non-contact current sensor and an AC inductor.

Various typical/conventional current sensors can be integrated into an inductor/current sensor according to a seventh embodiment of the present invention. Examples of commercially available current sensing resistor products that can be integrated into an inductor/current sensor are: Caddock Electronics' Type MV Power Film Resistor; Isotek's PMA, PMD Surface Mount four terminal package; Caddock Electronics' Type SR10 Current Sense Resistor; Isotek's RTO Heat Sink Base Mount with two and four terminal configurations; IRC's OARS series Surface Mount sense resistor. Caddock Electronics' Type MV Power Film Resistor is described in Caddock's Datasheet "Type MV Low Resistance Power Film Resistors", the entire contents of which are hereby incorporated by reference. Isotek's PMA, PMD Surface Mount four terminal package is described in Isotek's Datasheet "PMA, PMD Precision Current Sensing Resistors", the entire contents of which are hereby incorporated by reference. Caddock Electronics' Type SR10 Current Sense Resistor is described in Caddock's Datasheet "Type SR Precision Current Sense Resistors", the entire contents of which are hereby incorporated by reference. Isotek's RTO Heat Sink Base Mount with two and four terminal configurations are described in Isotek's Datasheets "RTO Precision Current Sensing Resistors" and "RUG-Z Precision Current Sensing Resistors", the entire contents of which are hereby incorporated by reference. IRC's OARS series Surface Mount sense resistors are described in the IRC TT Electronics Datasheet "OARS Series, Open Air Sense Resistors", the entire contents of which are hereby incorporated by reference.

In accordance with embodiments of the present invention, various current sensors, such as, for example, the current sensors mentioned above, can be integrated into one package with an inductor, to obtain an integrated inductor/current sensor. Such an integrated inductor/current sensor provides sensing capabilities without introducing into a circuit an additional package besides the inductor package.

FIG. 10A illustrates a known four-wire resistor with Kelvin sense leads, which can be integrated into an inductor/current sensor according to a seventh embodiment of the present invention. FIG. 10B illustrates aspects of simulations for a four-wire resistor using a PC board trace. In accordance with embodiments of the present invention, various current sensors such as a 4-wire resistor with Kelvin sense leads, or a 2-wire shunt resistor can be integrated into one package with an inductor, to obtain an integrated inductor/current sensor. According to a seventh embodiment of the present invention, packaging of a conventional current sensor with an inductor results in ease of manufacturing and ease of installation. Moreover, a conventional current sensor packaged with an inductor requires less thermal management equipment than individual current sensors and inductors. An integrated package including a current sensor and an inductor uses common elements such as core external packaging, etc., between the current sensor and the inductor, which reduces cost and weight. Furthermore, integration reduces parts-count and eliminates stand-alone current sensors. Stand-alone current sensors present multiple drawbacks. They are very expensive, bulky, and heavy; they require additional space and custom H/W such as interconnecting bus-bars/cables and other mounting fixtures for proper installation and thermal management. Thermal management is particularly difficult to achieve for stand-alone AC current sensors, due to trapped heat generated by internal power dissipation. Trapped heat is a significant problem in electric power systems, and particularly so in high power applications.

FIG. 11 illustrates a circuit diagram for an integrated current sensor which senses inductor voltage and which does not require an isolation op-amp according to an eighth embodiment of the present invention. The integrated current sensor 100G illustrated in FIG. 11 includes the following components: an inductor 601; resistors 603 (with resistance $R_{11}$), 605 (with resistance $R_{22}$), 607 (with resistance $R_{33}$), and 611 (with resistance $R_{44}$); an over-voltage protection block 613; an integrator 615; and a gain control circuit 617.

For the integrated current sensor 100G illustrated in FIG. 11, the voltage $v_{33}$ at the integrator 615 input is expressed as:

$$v_{33} = \frac{R_{22}}{R_{11} + R_{22}} v_{11} - \frac{R_{33}}{R_{33} + R_{44}} v_{22}. \tag{14}$$

If resistors are selected such that $$R_{11} = R_{22}, R_{22} = R_{44}, \text{ and } \frac{R_{33}}{R_{33} + R_{44}} = \frac{R_{11}}{R_{11} + R_{22}},$$

then $v_{33}$ becomes:

$$v_{33} = \frac{R_{11}}{R_{11} + R_{22}} [v_{11} - v_{22}] = K_{11} v_L. \tag{15}$$

The output voltage $v_O$ for the integrated current sensor 100G can be obtained using techniques discussed at FIGS. 1 and 2, or at FIGS. 5A and 5B.

The integrated current sensor 100G does not require isolation op-amps, and realizes a virtual ground, thus eliminating the need for expensive voltage isolation circuitry. Moreover, the integrated current sensor 100G allows measurement of the AC system voltage with respect to the virtual ground in the same integrated package. Single-point-failures can be mitigated through proper choice of multiple parallel/series resistors in the resistive network voltage divider, and with the over-voltage protection block 613. The over-voltage protection block 613 may include protection devices, such as, for example, transorbs.

Figure 12:
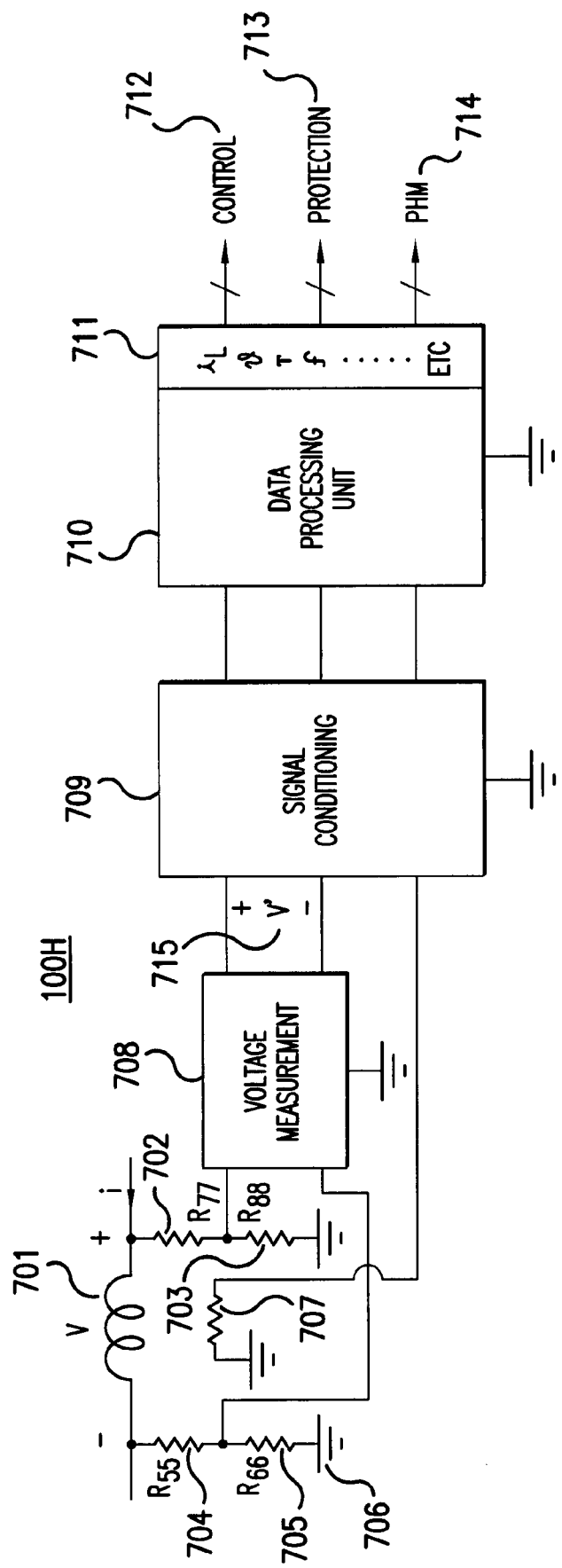
FIG. 12 illustrates a conceptual circuit diagram for an integrated current sensor which demonstrates integration of measurement and transmission of additional electric power in the same inductor/current sensing package, according to a ninth embodiment of the present invention.

FIG. 12 illustrates a conceptual circuit diagram for an integrated current sensor 100H which demonstrates integration of measurement and transmission of additional electric power in the same inductor/current sensing package, according to a ninth embodiment of the present invention. FIG. 12 illustrates another preferred embodiment for an integrated inductor/current sensor. One inductor 701 is shown in FIG. 12 as a line filter/choke. AC current sensing is achieved by feeding a voltage (v' at point 715) proportional to the inductor voltage (v) to a data processing unit 710, after measurement in a voltage measurement unit 708, and signal conditioning in unit 709. Signal integration, gain adjustment, and compensation are all achieved in block 710. Block 710 may comprise hardware and software/firmware items such as ASIC, FPGA, Microprocessors, Digital Signal Processors, etc.

Element 707 is a Resistive Temperature Detector (RTD) which is introduced in the same integrated package of sensor 100H, to detect the worst case temperature for Prognostics Health Monitoring (PHM). Block 710 can also use received information to detect AC line voltage and frequency. This information can be locally used or bundled together with other similar measurements (real-time inductor temperature, point-of-regulation (POR) AC system voltage, AC system frequency, etc.) from other AC lines, and communicated to an external unit for control (712), protection (713), and/or PHM (714). Control sequencing, and prognostic health monitoring and diagnostics for fault tolerant operation can be implemented with an electronics-based system that controls transitions between a plurality of operating modes to ensure fail-safe operation without unnecessary tripping, cold-starts or system resets upon the occurrence of certain fault conditions, etc., the electronics-based system including a prognostic health monitoring and diagnostic unit that identifies present out-of-range conditions, overload conditions, and trending violations, for components of the system. Such an electronics-based system for prognostic health monitoring is described in the US Patent application 20030204777 titled "Control Sequencing and Prognostics Health Monitoring for Digital Power Conversion and Load Management" filed on Apr. 14, 2003, the entire contents of which are hereby incorporated by reference.

The present invention describes methods and apparatuses in which an AC inductor is modified to measure AC current in the same integrated package. Hence, the methods and apparatuses of the present invention achieve functions of inductor and current sensor in one integrated inductor/current sensor package. Expensive and heavy current sensors, bus-bars, cables, and other mounting fixtures typically used for current sensing are eliminated. An electrical power system including integrated AC inductor/current sensors described in the current invention is not disturbed at two different locations, for introducing two different components (an inductor and a current sensor) in the circuit. Using the integrated AC inductor/current sensors described in the current invention, an inductor and a current sensor are introduced in a single package at one location, in an electrical power system.

Using methods and apparatuses of the current invention, traditional current sensors, such as current transformers, Hall Effect current sensors, shunt resistors, non-contact current sensors, or other current sensing means, can be integrated into a single package with the inductor to achieve an integrated inductor/current sensor.

Using methods and apparatuses of the current invention, inductor voltage after signal conditioning can be digitized and fed to a suitable data-processing unit that includes the function of integrating the inductor voltage to obtain the inductor current, as described at FIG. 12. Electrical circuits such as H/W only based systems, differential-amplifiers or instrumentation-amplifiers, embedded control systems based on both H/W and S/W such as FPGAs, ASICs, Microprocessors or Digital Signal Processors, etc., can be used to implement integrated inductor/current sensors described in the current invention. Other electrical parameters of interest, such as real-time inductor temperature, point-of-regulation (POR) AC system voltage, and/or AC system frequency can be integrated for control or PHM, into the inductor/current sensor packages of the current invention.

Integrated AC inductor/current sensors described in the current invention reduce overall cost and weight of electrical systems, allow reductions in parts count/inventory, facilitate manufacturing and testability, provide highly accurate current measurements, are cost-effective and lightweight, and have wide current/temperature range. Other electrical parameters of interest, such as inductor temperature and point-of-regulation (POR) voltage, can be integrated for measurement/processing into the inductor/current sensor packages described in the current invention. Any such measured or inferred analog and/or discrete status signals (i.e. line current, AC system voltage, AC system frequency, inductor temperature, etc.) can be sent to a controller through individual analog/discrete signals, or bundled together and sent through low cost serial communication ports, or through wireless communication or Power Line Carrier Methods, depending on the application. This level of integration is highly cost-effective and reduces cost and weight for remote current sensing applications, because it can improve signal-to-noise ratio, and eliminate cross-talk and signal degradation due to long analog/discrete signal wires.

Although detailed embodiments and implementations of the present invention have been described above, it should be apparent that various modifications are possible without departing from the spirit and scope of the present invention. In particular, any other methods including, but not limited to, electrical circuits or embedded control systems, can be used for realizing the described functions of different blocks illustrated in the figures of the present invention. Such electrical circuits may be circuits based on only H/W items, such as differential-amplifiers or instrumentation-amplifiers. Embedded control systems may be systems based on both hardware and firmware/software. Such embedded control systems include FPGAs, ASICs, Microprocessors, Digital Signal Processors, etc.

I claim:

1. An integrated current sensor for use in an AC electric power system, said current sensor comprising:
   an integrator circuit, said integrator circuit receiving a voltage associated with an AC current passing through an inductor of the AC electric power system;
   a transformer connected between the integrator circuit and inductor;
   a transorb connected between the integrator circuit and the inductor, wherein the transorb is configured to clamp over-voltages in the current sensor;
   a gain control circuit operationally connected to said integrator circuit, said gain control circuit outputting a gain controlled signal; and
   a compensation circuit directly connected to the inductor and operationally connected to at least one of said integrator circuit and said gain control circuit, to compensate for parameter variation induced in said gain controlled signal or in the output of said integrator circuit.

2. The current sensor according to claim 1, wherein said gain controlled signal is a voltage proportional to said AC current.

3. The current sensor according to claim 1, wherein said gain control circuit has adjustable gain, and said compensation circuit compensates for temperature variation induced in said gain controlled signal.

* * * * *